United States Patent [19]

Gyngell

[11] Patent Number: 4,699,148
[45] Date of Patent: Oct. 13, 1987

[54] NUCLEAR MAGNETIC RESONANCE IMAGING

[75] Inventor: Michael L. Gyngell, Berkhampstead, England

[73] Assignee: Picker International Ltd., Wembley, England

[21] Appl. No.: 893,689

[22] Filed: Aug. 6, 1986

[30] Foreign Application Priority Data

Nov. 18, 1985 [GB] United Kingdom ................. 8528357

[51] Int. Cl.$^4$ .............................................. A61B 5/05
[52] U.S. Cl. ..................................... 128/653; 324/309
[58] Field of Search ................ 128/653; 324/307, 309, 324/312

[56] References Cited

U.S. PATENT DOCUMENTS

| 4,015,196 | 3/1977 | Moore et al. |
| 4,184,110 | 1/1980 | Hinshaw. |
| 4,339,716 | 7/1982 | Young ................................. 324/309 |
| 4,506,222 | 3/1985 | Edelstein et al. .................. 324/309 |
| 4,532,474 | 7/1985 | Edelstein ........................... 324/309 |

Primary Examiner—William E. Kamm
Assistant Examiner—Ruth S. Smith
Attorney, Agent, or Firm—Timothy B. Gurin

[57] ABSTRACT

In a steady state free precession (SFP) magnetic resonance imaging method, after each pulse of an applied train of phase coherent RF pulses which excite magnetic resonance spins in a region of a body being examined, magnetic field gradients are applied to encode the excited spins and the encoded spins are detected, and at least one further magnetic field gradient is then applied to rephase the spins by the time the next RF pulse is applied.

6 Claims, 5 Drawing Figures

NUCLEAR MAGNETIC RESONANCE IMAGING

This invention relates to nuclear magnetic resonance (NMR) imaging methods.

The use of fast data acquisition methods in NMR Imaging offers the clinical advantages of faster examination of patients, improved patient comfort, and reduction in motion related image artifacts due to reduced scan times.

The Steady-state Free Precession (SFP) NMR technique involves exciting a suitable sample with a train of phase coherent radio frequency (RF) pulses such that the pulse separation is less than or comparable to the characteristic $T_2$ and $T_1$ of the sample. Known applications of the SFP technique to NMR imaging involve the use of image reconstruction by filtered back-projection. The projections are obtained using d.c. projection gradients, with slice definition being by the null point of an oscillating gradient orthogonal to projection gradient. Consequently, known SFP NMR imaging methods cannot be regarded as fast data acquisition methods.

It is an object of the present invention to provide an SFP NMR imaging method which allows NMR data to be acquired more rapidly than has hitherto been possible.

According to the present invention there is provided an SFP NMR imaging method wherein, after each of a train of phase coherent RF pulses which excite NMR signals in a region of a body being examined, magnetic field gradients are applied to encode the excited spins and the encoded spins are detected, and at least one further magnetic field gradient is then applied to rephase the spins by the time the next RF pulse is applied.

In a preferred embodiment of the invention the applied encoding magnetic field gradients serve to encode the spins in such a manner as to allow a multidimensional Fourier transform technique to be used to reconstruct an image from the detected signals.

Two methods in accordance with the invention will now be described, by way of example, with reference to the accompanying drawings in which:-

As in all SFP techniques, the methods to be described basically involve the application of a train of coherent RF pulses in the presence of a steady magnetic field which defines an equilibrium axis of magnetic alignment in a body to be examined to excite spins in a selected region of the body to be examined. In accordance with the invention, between each adjacent pair of pulses in the train, magnetic field gradients are applied, first to encode the spins and so confer spatial information on the spins subsequently detected, thereby to permit reconstruction of an image from the detected spins, and then to obtain rephasing of the spins by the time the next RF pulse occurs. The applied RF pulses then maintain the material of the body selected for examination in a steady state of excitation, as required.

The gradients applied depend on the region to be examined, and the image reconstruction method to be employed.

Figure 1:
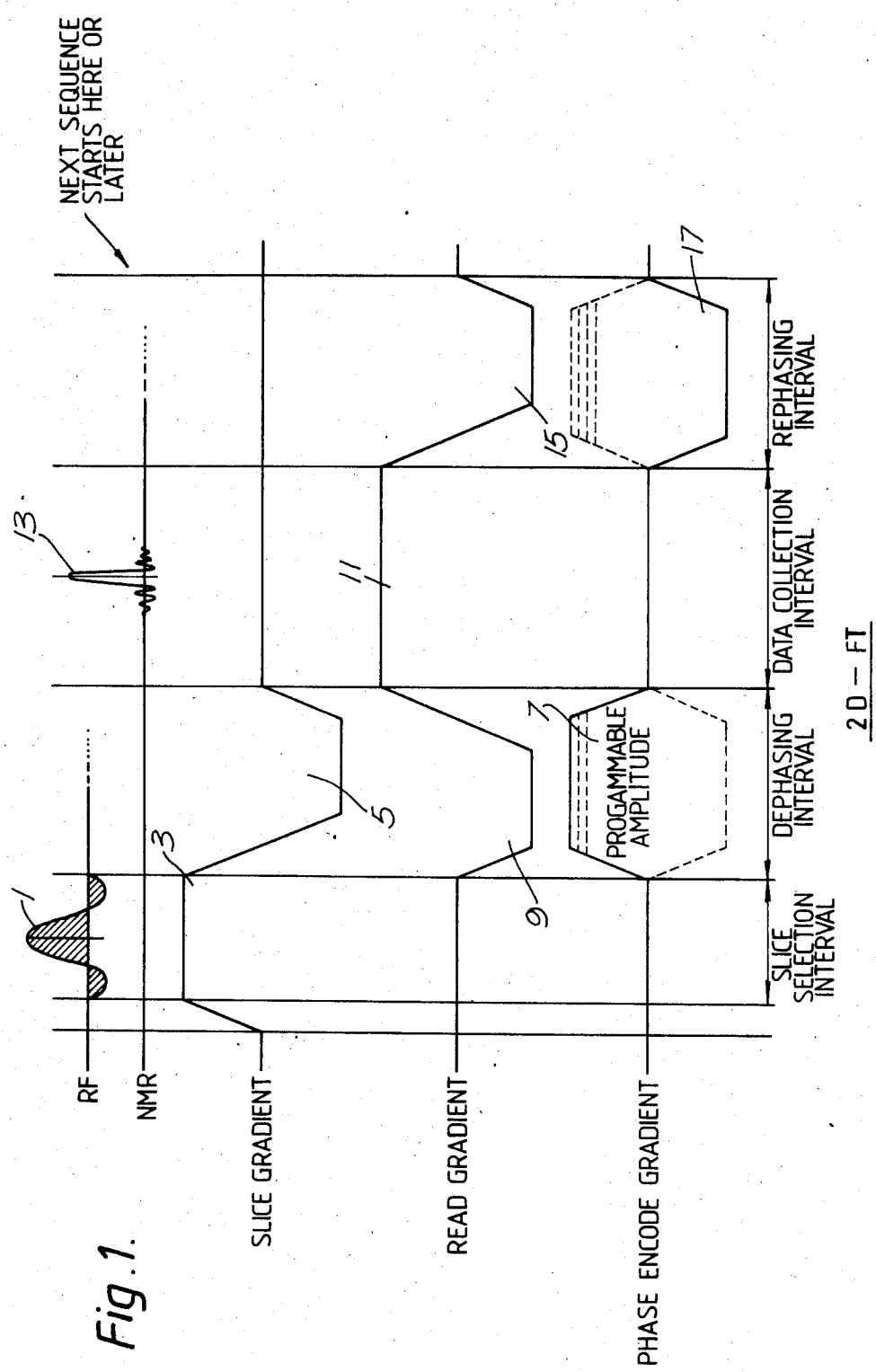
FIG. 1 illustrates the basic pulse sequence used in the embodiments for two-dimensional i.e. slice imaging.

Referring to FIG. 1, where a selected slice is to be examined using a two-dimensional Fourier transform (2 DFT) image reconstruction technique, each RF pulse 1 is applied during a slice selection magnetic field pulse 3 whereby a gradient is imposed on the steady magnetic field, which defines an equilibrium axis of magnetic alignment in the body, in a direction normal to the plane of the slice. The RF and gradient pulses 1 and 3 are chosen so that the Larmor frequency of chosen protons of nuclear species in the selected slice under the applied gradient magnetic field is at the frequency of the RF pulse. As a result, nuclear spins are preferentially excited in the selected slice.

Following the gradient pulse 3 a reverse direction gradient pulse 5 is applied to rephase spins in the selected slice against dephasing resulting from the gradient across the slice during excitation.

At the same time a phase encoding magnetic field pulse 7 is applied having a gradient in a first direction in the plane of the slice to phase encode the excited spins.

In addition, a further gradient pulse 9 in a second direction in the plane of the slice, orthogonal to the first direction, is applied. After the phase encoding pulse 7 ends, the gradient pulse 9 is replaced by a reverse direction frequency encoding read gradient pulse 11 which is maintained during detection of the free/induction decay (FID) signal 13. After detection of the FID signal 13 magnetic field gradient pulses 15 and 17 respectively corresponding to, but in the reverse directions to, the read gradient and phase encoding pulses 11 and 7 are applied, thereby to rephase the spins substantially completely at the time of application of the next RF pulse, whereupon the sequence is repeated.

It will be appreciated that the gradient pulse 9 preceding the read gradient pulse 11 compensates in known manner for dephasing of spins during application of the read gradient pulse 11.

In a modification of the sequence of FIG. 1, a slice selection direction gradient pulse is applied after read out in such a sense, i.e. in the same sense as pulse 5, to compensate for dephasing of spins during the part of the next pulse 3 preceding the center of the next RF pulse 1.

Figure 2:
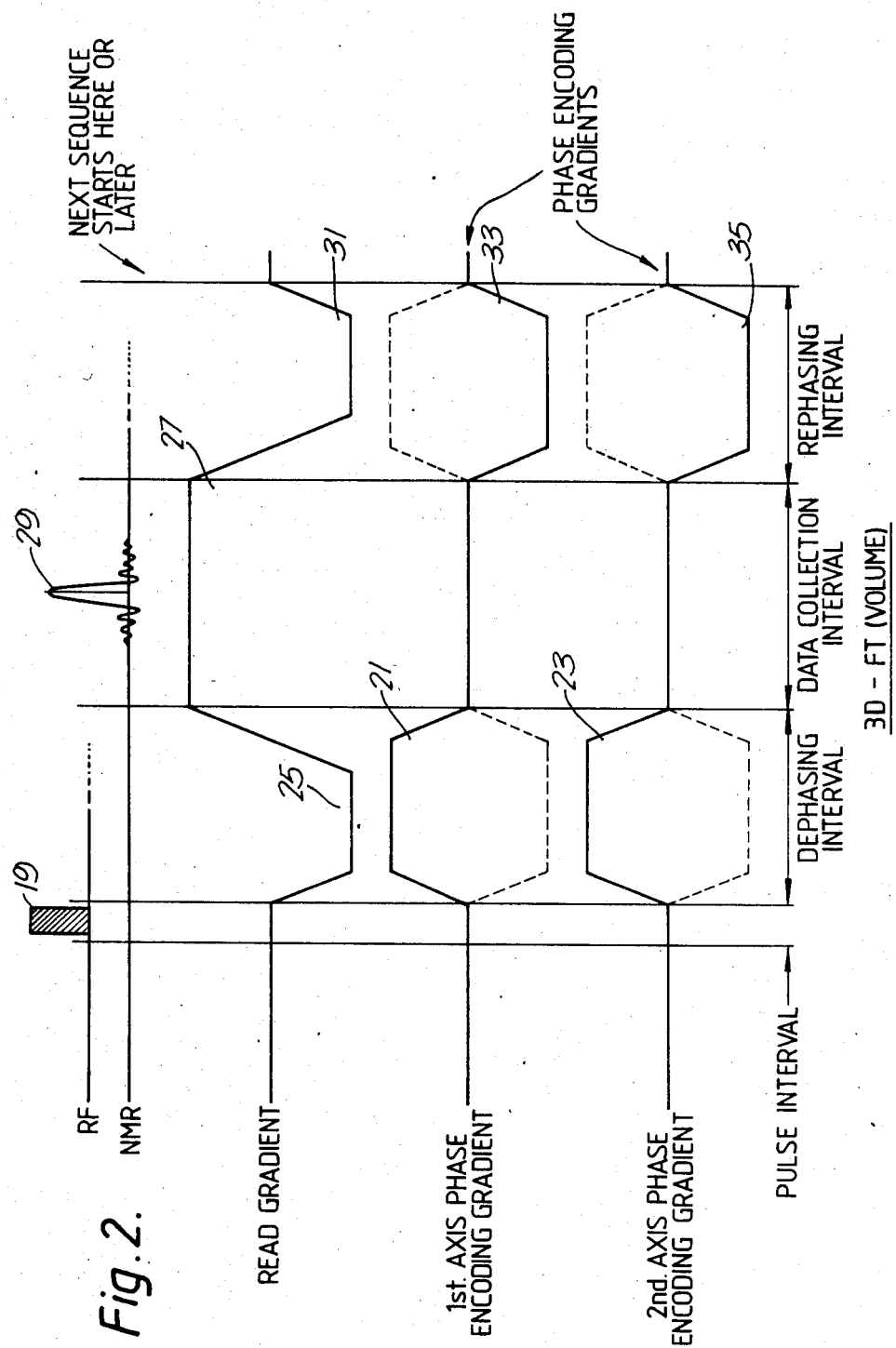
FIG. 2 illustrates the basic pulse sequence used in the embodiments for three-dimensional, i.e. volume, imaging.

Referring to FIG. 2, where a three-dimensional volume of the body is to be examined using 3 DFT image reconstruction technique, each RF pulse 19 is applied in the absence of any gradient to excite spins throughout the body rather than only in a slice thereof. Two phase encoding pulses 21 and 23 and a further gradient pulse 25 are applied immediately after the RF pulse 19, and the pulse 25 replaced by a reverse direction read gradient pulse 27 maintained during detection of the FID signal 29. After signal detection, gradient pulses 31, 33 and 35 corresponding to, but in the reverse direction to, the read gradient pulse 27 and the phase encoding pulses 21 and 23 respectively are applied, thereby to rephase the spins at the time of application of the next RF pulse.

Figure 3:
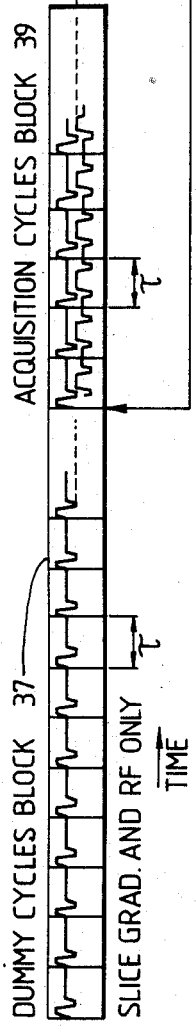
FIGS. 3, 4 and 5 illustrate how the sequence of FIGS. 1 and 2 are strung together to perform a complete imaging sequence.

Referring now to FIG. 3, in the first complete imaging sequence in accordance with the invention to be described a block 37 of a number of cycles, e.g. twenty to fifty cycles, of a sequence as shown in FIG. 1 or FIG. 2, but without read and phase encoding gradient pulses or detection of FID signal, i.e. dummy cycles, is first performed. This serves to establish steady state conditions in the region of the body to be examined.

Data acquisition then starts. This comprises performing a block 39 of a number of cycles e.g. ten to a hundred, of the sequence shown in FIG. 1 or FIG. 2, with a first value for the or each phase encoding gradient, the resulting FID signals being averaged and stored. This process is then repeated for each different value of the phase encoding gradient or gradients required to enable reconstruction of an image of desired resolution from the stored averaged FID signals in known manner. Typically each sequence as shown in FIGS. 1 and 2 takes about 20 milliseconds. Hence for 256 different values of phase encoding gradient and averaging sixteen FID signals for each value of phase encoding gradient a total data collection time of about 82 seconds is required.

Data collection time may be reduced in the limit, by dispensing with signal averaging, to about 6 seconds.

In the second embodiment to be described a series of complete images are obtained as steady state conditions are approached either from an equilibrium or a saturation condition.

Figure 4:
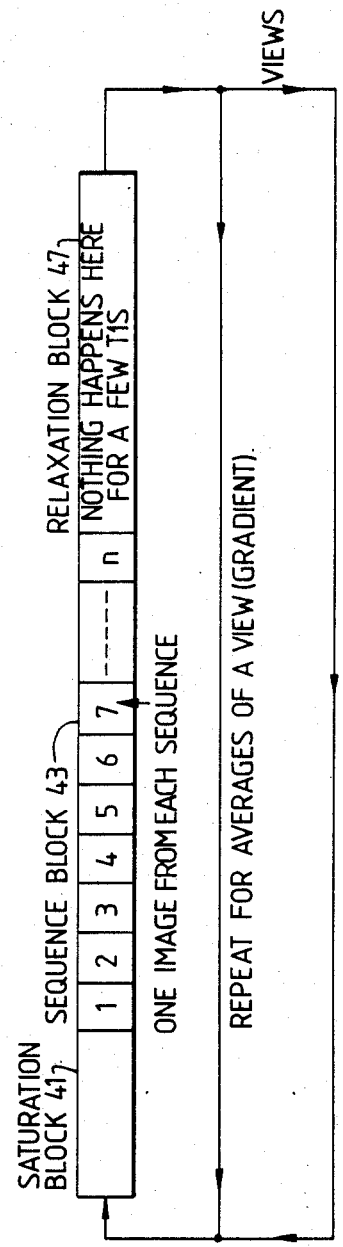
Figure 5:
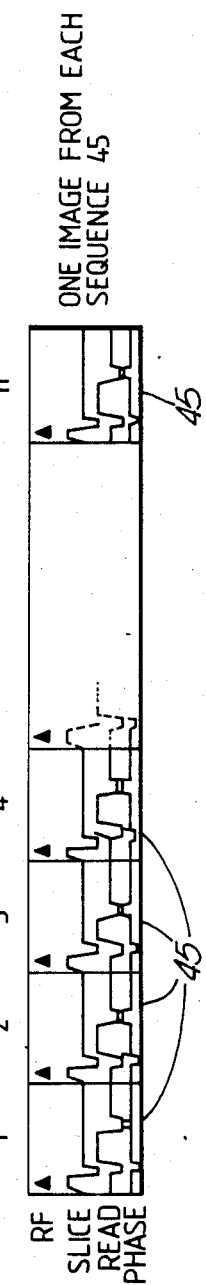

Referring to FIG. 4, if approach from saturation conditions is required, the method starts with any suitable known sequence to establish saturation conditions, as indicated at 41 in FIG. 4. A block 43 of n sequences 45, where n is the number of different complete images required, is then performed, each sequence 45 being of the form shown in FIG. 1 or FIG. 2, as required, and even sequence 45 employing the same value for the or each phase encoding gradient, as illustrated in greater detail in FIG. 5.

A period 47 of from one to two seconds is then allowed to elapse to allow equilibrium to be restored if required. The block 43 of sequence 45 followed by a relaxation period 47, if required, is then repeated, preceded by a saturation sequence 41 if required, for each required different value of the phase encoding gradient or gradients.

Using the FID signals obtained from the first sequence 45 in each block 43 of sequences a first image is then constructed, and a second image is constructed using the FID signals obtained from the second sequence 45 in each block 43, and so on, giving n different images each at different condition between equilibrium or saturation and steady state.

It will be appreciated that if desired more than one sequence block 43 for each value of phase encoding gradient may be performed, and the resulting detected FID signals for the different sequences 45 in each block 43 respectively averaged to improve signal to noise ratio.

It will be understood that in an imaging method according to the invention it is essential that the RF pulses are phase coherent. However, the RF pulses may be all of the same phase or phase alternated from one sequence to the next (i.e. 0° then 180° or −90° then +90°). However, the detected signals are fairly insensitive to RF pulse angle between about 50° and 100°, the available signal varying only about 10% over this range so that the method is insensitive to RF field homogeneity.

A further feature of a method according to the invention is that since the read and phase encoding gradients average to zero over each excitation and signal detection sequence the effect of eddy currents is minimized.

It will further be understood that whilst in the particular methods in accordance with the invention described by way of example, spatial information is conferred on the detected FID signals by phase encoding, other spatial encoding techniques may be used in other methods in accordance with the invention. However, whatever spatial encoding method is used, it is essential that after FID signal detection, the encoding gradients are reapplied in reverse sense, and that the successive pulses in the applied train of RF pulses are coherent and, of course, sufficiently frequent to establish SFP conditions. When for example, phase alternated RF pulses are used the steady state magnetisation produced by alternate pulses is given by:

$$M_x = -E_2 S_\beta S_\alpha Q$$

$$M_y = S_\alpha (1 + E_2 C_\beta) Q$$

$$M_z = \{C_\alpha(1 + E_2 C_\beta) + E_2(E_2 + C_\beta)\} Q$$

and $$Q = M_o(1 - E_1)/\{(1 - E_1 C_\alpha)(1 + E_2 C_\beta) - E_2(E_1 - C_\alpha)(E_2 + C_\beta)\}$$

where
$S_\alpha = \sin\alpha$, $C_\alpha = \cos\alpha$
$S_\beta = \sin\beta$, $C_\beta = \cos\beta$
$E_2 = \exp(-t/T_2)$, $E_1 = \exp(-t/T_1)$
$M_o$ is the equilibrium magnetisation
$\alpha$ is the pulse angle
$\beta = \Delta\omega t$ where $\Delta\omega$ is the resonance offset (radians/second) from the Larmor frequency
$T_2$ = Spin-spin relaxation time
$T_1$ = Spin-lattice relaxation time.

The magnetisation is clearly periodic with respect to resonance offset, and this periodicity causes a 30 to 40% reduction in the available signal when the SFP technique is used in previously known manner with d.c. projection gradients. However, this periodicity will not arise in a method according to the invention because the magnetisation is always rephased before RF pulses are applied.

It is pointed out that while in the methods according to the invention described by way of example magnetic field gradient rephasing pulses are after detection applied with respect to both phase encoding gradients and read gradients, in other methods in accordance with the invention it may be possible to dispense with some of the rephasing gradients. For example in the particular methods described above by way of example with reference to FIGS. 1 and 2 the rephasing gradients 15 and 31 may be dispensed with without significant deterioration in the resulting image.

I claim:

1. A nuclear magnetic resonance imaging method comprising the steps of: applying a train of phase coherent radio frequency pulses to a body in the presence of a steady magnetic field which defines an equilibrium axis of magnetic alignment in the body to excite steady state nuclear magnetic spins in a region of the body to be examined; after each said radio frequency pulse applying at least one encoding magnetic field gradient to encode the excited spins, detecting the encoded spins, and after each such detection applying at least one rephasing magnetic field gradient effective to rephase the spins by the time the next radio frequency pulse is applied; and utilizing the detected spins to reconstruct an image of said region.

2. A method according to claim 1 wherein said at least one encoding magnetic field gradient comprises a phase encoding gradient and said at least one rephasing gradient comprises a gradient corresponding to said encoding gradient but of reverse direction.

3. A method according to claim 1 wherein said at least one encoding magnetic field gradient comprises a read gradient applied during detection.

4. A method according to claim 3 wherein said read gradient is preceded by a gradient of reverse direction to compensate for dephasing of spins during application of said read gradient and said at least one rephasing gradient is in the same direction as said gradient preceding said read gradient.

5. A method according to claim 1 wherein said encoding magnetic field gradients are such as to allow a multi-dimensional Fourier transform technique to be used to reconstruct said image.

6. A method according to claim 1 wherein each said radio frequency pulse is applied in the presence of a selection magnetic field gradient and said at least one rephasing magnetic field gradient compensates for dephasing of spins due to the selection magnetic field gradient associated with the next radio frequency pulse.

* * * * *